United States Patent [19]

Fujiwara

[11] Patent Number: 4,788,422

[45] Date of Patent: Nov. 29, 1988

[54] HIGH RESOLUTION ROTARY ENCODER HAVING APPOSITELY ROTATING DISKS

[75] Inventor: Toshiaki Fujiwara, Nara, Japan

[73] Assignee: Sharp Kabushiki Kaisha, Osaka, Japan

[21] Appl. No.: 933,146

[22] Filed: Nov. 21, 1986

[30] Foreign Application Priority Data

Nov. 25, 1985 [JP] Japan .................. 60-265338

[51] Int. Cl.$^4$ ............................................ H03M 1/24
[52] U.S. Cl. ..................... 250/231 SE; 250/237 G; 356/375; 341/2; 341/13
[58] Field of Search ............ 250/231 SE, 237, 6; 340/347 P; 356/375

[56] References Cited

U.S. PATENT DOCUMENTS 4,123,653 10/1978 Bovio ........................... 250/231 SE
4,358,753 11/1982 Cascini ........................... 340/347 P
4,616,131 10/1986 Burkhardt ..................... 250/231 SE

FOREIGN PATENT DOCUMENTS 2312729 3/1973 Fed. Rep. of Germany .

Primary Examiner—Edward P. Westin
Assistant Examiner—Charles F. Wieland
Attorney, Agent, or Firm—Birch, Stewart, Kolasch & Birch

[57] ABSTRACT

A rotary encoder having first and second slit disks are disposed between a light emitting diode and a light sensor coaxially in proximity to each other, the two slit disks each having a large number of slits formed radially at equal intervals in a peripheral edge portion of the disks, the first slit disk being connected to and rotated by a rotational shaft, and the second slit disk being rotated by interlocking gears in a direction opposite to that of the first disk.

7 Claims, 3 Drawing Sheets

FIG. 3
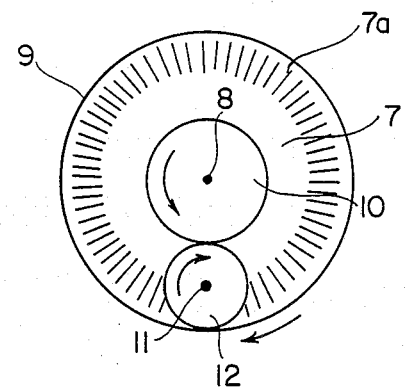
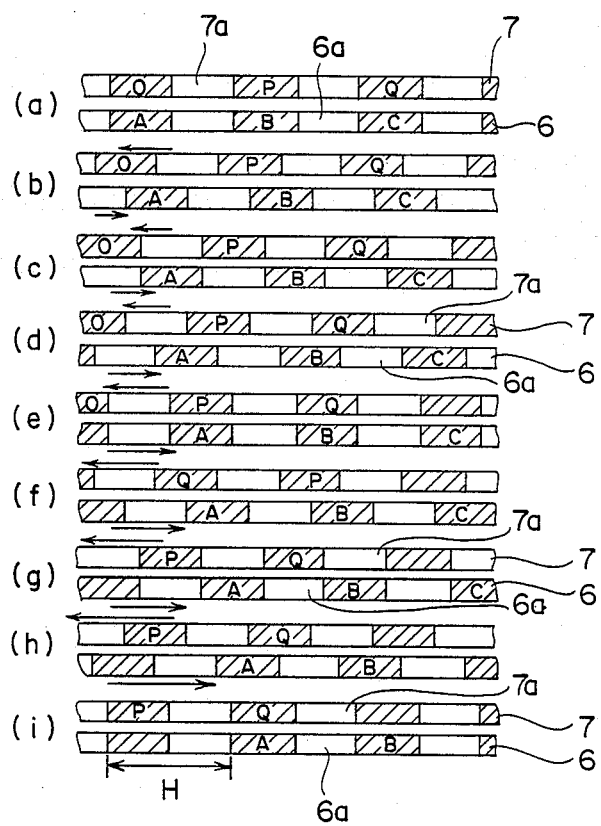
FIG. 4

HIGH RESOLUTION ROTARY ENCODER HAVING APPOSITELY ROTATING DISKS

BACKGROUND OF THE INVENTION

The present invention relates to a rotary encoder used, for example, as a moving pitch sensor for detecting an angle of rotation of a rotating shaft.

Conventional rotary encoders of this type are of such a construction as shown in FIG. 6 in which a fixed split plate 3 as an arcuate plate having slits 3a formed at equal intervals, and a rotary slit plate 5 mounted on a rotor 4 and having a multitude of slits 5a formed radially at equal intervals in a peripheral edge portion of a disk, are disposed between a light emitting portion 1 constituted by a light emitting diode and a light sensing portion 2 constituted by a photo diode.

In the rotary encoders of such a construction, however, in order to make occurate the detection angle with regard to rotation of the rotor 4, namely, the movable slit plate 5, there is no method other than either forming the slits 3a and 5a finely in a high density or enlarging the diameters of the slit plates 3 and 5. But larger diameters of the slit plates 3 and 5 result in an increase in size of the apparatus, and an extremely difficult technique is involved in forming the slits 3a and 5a finely in a high density. Therefore therefore, rotary encoders of the above construction encounter a resolution limit.

OBJECT OF THE INVENTION

The present invention has been accomplished in view of the above-mentioned problems and it is the object thereof to provide a rotary encoder capable of attaining a high resolution without requiring small widths and spacing of the slits and without requiring large diameters for the slit disks.

In order to achieve the above object, the gist of the present invention resides in a construction in which two slit disks, each having a multitude of slits formed radially at equal intervals in a peripheral edge portion thereof, are disposed coaxially in proximity to each other in positions between a light emitting portion and a light sensing portion, one slit disk being connected to a rotational shaft, and both slit disks being rotated in an interlocked manner in directions opposite to each other.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 1 to 5 illustrate a rotary encoder according to an embodiment of the present invention, of which:

FIG. 1 is a perspective view;
FIG. 2 is a longitudinal sectional view;
FIG. 3 is a front view;
FIGS. 4 (a) to (i) are views explanatory of changes in positional relation between slits during rotation of both slit disks;
and
FIG. 5 is a waveform diagram of output signals from a light sensing portion during the rotation in FIG. 4.

DESCRIPTION OF THE PREFERRED EMBODIMENT

An embodiment of the present invention will be described in detail hereinunder.

Figure 1:
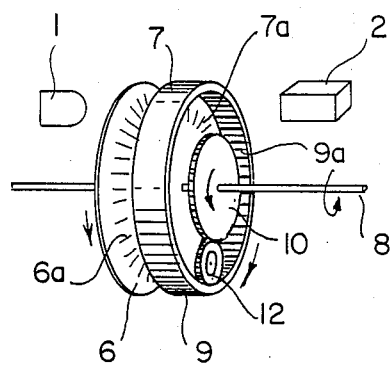
Figure 2:
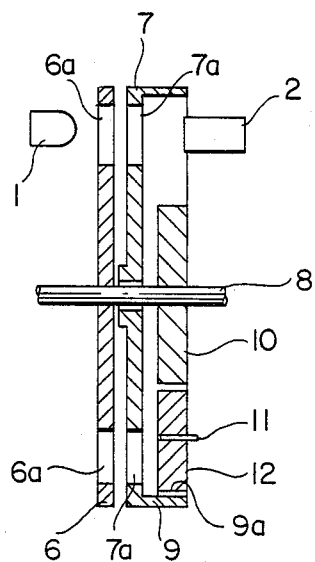

Referring first to FIGS. 1 to 3, there is illustrated an embodiment of the invention, in which two slit disks 6 and 7 of the same diameter having a large number of slits 6a and 7a formed radially at equal intervals in the respective peripheral edge portions, are disposed between a light emitting portion 1 and a light sensing portion 2 coaxially in proximity to each other. One slit disk 6 is connected to a rotational shaft 8 to be detected for rotation, while the other slit disk 7 is fitted on the rotational shaft 8 rotatably with respect to the same shaft. Further, a cylindrical body 9 having tooth grooves 9a formed in an inner peripheral surface thereof is provided integrally with the slit disk 7. A drive gear 10 is formed on the rotational shaft 8 and a transfer gear 12 supported rotatably in a cantilevered state by a support shaft 11 is in mesh with both the drive gear 10 and the tooth grooves 9a of the cylindrical body 9.

Figure 5:
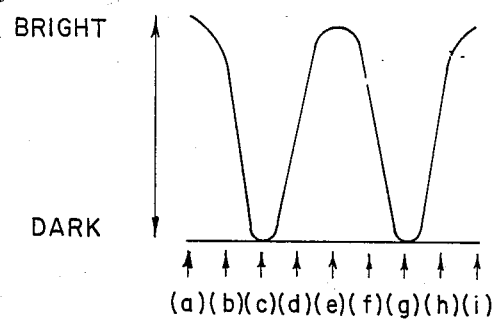
Figure 6:
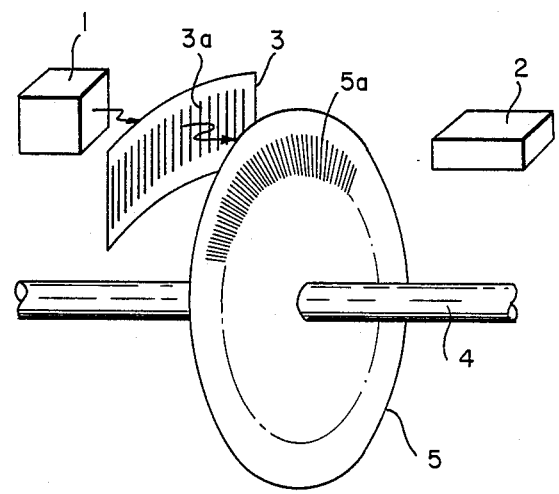
FIG. 6 is a perspective view of a conventional rotary encoder.

The operation of this embodiment having the above construction will be explained below with reference to FIGS. 4 and 5.

The slit disk 6 connected to the rotational shaft 8 rotates together with the shaft 8, while the other slit disk 7 to which is transmitted the rotation of the shaft 8 through the drive gear 10, transfer gear 12 and tooth grooves 9a of the cylindrical body 9, rotates in an interlocked manner in a direction opposite to the slit disk 6.

Explanation will now be made about output signals provided from the light sensing portion 2 upon rotation at a certain angle of the slit disk 6 which rotates together with the rotational shaft 8. It is here assumed that from an initial state in which the slits 6a and 7a of the slit disks 6 and 7 are in coincidence with each other as shown in FIG. 4 (a), the slit disk 6 and the other slit disk 7 rotate in the clockwise and counterclockwise directions, respectively, in the figure. When the slit disk 6 of the present invention rotates the same distance as a distance of rotational movement, H, of the conventional movable slit disk 5, the relative relation of the slits 6a and 7a of the slit disks 6 and 7 shifts successively from (a) to (i) in FIG. 4, and at this time output signals provided from the light sensing portion 2 exhibit such a waveform as shown in FIG. 5, in which (a) to (i) represent positions of (a) to (i) in FIG. 4. From FIG. 5 it is seen that dark signals were generated twice due to a complete interception of light and that resolution is improved. In the illustrations of FIGS. 4 and 5 both slit disks 6 and 7 are set at the same rotating speed, but even where the rotating speed of the slit disk 7 is lower than that of the slit disk 6, there can be attained a higher resolution than with the use of the conventional fixed slit plate 3.

According to the construction of the rotary encoder of the present invention, as set forth hereinabove, two slit disks each having a large number of slits formed radially at equal intervals on the peripheral edge portion thereof are disposed coaxially, one of which is connected to a rotational shaft to be detected for rotation, and both slit disks are rotated by interlocking gears in a direction Consequently, a high resolution can be obtained without enlarging the diameter of the slit disks and without reducing the width and spacing of the slits. Moreover, in the case of obtaining the same resolution as in the prior art, the width of the slit can be made larger and in this case not only con the slit disks be fabricated more easily, leading to a reduction in cost, but also it is possible to attain a reduction in size.

Further, where the slit width is made sufficiently large, it is possible to obtain a satisfactory effect of with regard to the interception of light from the light emitting portion even if the spacings between the light emitting portion and the two slit disks are made larger.

While only certain embodiments of the present invention have been described, it will be apparent to those skilled in the art that various changes and modifications may be made therein without departing from the spirit and scope of the present invention as claimed.

What is claimed is:

1. A rotary encoder which comprises:
   a first disk having a first plurality of slits formed at equal intervals in the peripheral edge thereof;
   a second disk disposed adjacent to and coaxial with said first disk, wherein said second disk has a second plurality of slits formed at equal intervals in the peripheral edge thereof and aligned corresponding to said first plurality of slits, said first and second disks having first and second outer faces;
   a light emitting source disposed at said first outer face; and
   a light sensor disposed at said second outer face for sensing light emitted from said light emitting source through said first and second pluralities of slits;
   wherein said first and second disks rotate in opposite directions.

2. A rotary encoder as defined in claim 1, wherein said first and second disks are coaxially and rotatably mounted on a rotational shaft.

3. A rotary encoder as defined in claim 2, wherein said first disk is directly driven in a first direction by said rotational shaft; and wherein said rotational shaft further includes a drive gear member mounted thereon and said second disk further includes a transfer gear member operatively associated therewith so that said rotational shaft directly drives said drive gear member which in turn operatively engages said transfer gear member which in turn drives said second disk in a direction opposite to said first direction.

4. A rotary encoder as defined in claim 3, wherein said second disk further includes a cylindrical wall having an inner peripheral surface for engaging said transfer gear member which drives said second disk.

5. A rotary encoder as defined in claim 4, wherein said drive gear member, said transfer gear member, and said inner peripheral surface of said cylindrical wall each include gear teeth members for operatively engaging each other, and wherein said rotary encoder may be used as a moving pitch sensor having high resolution.

6. A rotary encoder as defined in claim 5, wherein said light emitting source comprises a light emitting diode and said light sensor comprises a photo diode, and wherein said rotary encoder may be used to detect an angle of rotation of a rotating shaft.

7. A rotary encoder as defined in claim 6, wherein said transfer gear member is rotatably supported by a support shaft in a cantilever position.

* * * * *